US009934992B2

(12) United States Patent
Weichart

(10) Patent No.: US 9,934,992 B2
(45) Date of Patent: Apr. 3, 2018

(54) CHAMBER FOR DEGASSING SUBSTRATES

(71) Applicant: Evatec AG, Trubbach (CH)

(72) Inventor: Jurgen Weichart, Balzers (LI)

(73) Assignee: EVATEC AG, Trübbach (CH)

( * ) Notice: Subject to any disclaimer, the term of this patent is extended or adjusted under 35 U.S.C. 154(b) by 0 days.

(21) Appl. No.: 15/111,537

(22) PCT Filed: Dec. 10, 2015

(86) PCT No.: PCT/EP2015/079229
§ 371 (c)(1),
(2) Date: Jul. 14, 2016

(87) PCT Pub. No.: WO2016/092007
PCT Pub. Date: Jun. 16, 2016

(65) Prior Publication Data
US 2016/0336204 A1 Nov. 17, 2016

Related U.S. Application Data

(60) Provisional application No. 62/090,529, filed on Dec. 11, 2014.

(51) Int. Cl.
H01L 21/67 (2006.01)
H01L 21/324 (2006.01)

(52) U.S. Cl.
CPC ...... H01L 21/67155 (2013.01); H01L 21/324 (2013.01); H01L 21/67017 (2013.01); H01L 21/67098 (2013.01); H01L 21/67161 (2013.01); H01L 21/67167 (2013.01); H01L 21/67178 (2013.01); H01L 21/67184 (2013.01); H01L 21/67207 (2013.01)

(58) Field of Classification Search
CPC ............ H01L 21/324; H01L 21/67155; H01L 21/67161; H01L 21/67178; H01L 21/67207
See application file for complete search history.

(56) References Cited

U.S. PATENT DOCUMENTS

| 3,656,454 A | 4/1972 | Schrader |
| 6,497,734 B1 | 12/2002 | Barber |
| 7,090,741 B2 | 8/2006 | Narushima |
| 7,431,585 B2 | 10/2008 | Zhao |
| 2001/0013161 A1* | 8/2001 | Kitano ................ G03F 7/70991 29/25.01 |
| 2006/0223233 A1* | 10/2006 | Zhao ................. H01L 21/67109 438/109 |
| 2011/0114623 A1 | 5/2011 | Goodman |

OTHER PUBLICATIONS

International Search Report for PCT/EP2015/079229 dated Feb. 24, 2016.
Written Opinion for PCT/EP2015/079229 dated Feb. 24, 2016.

* cited by examiner

Primary Examiner — Fei Fei Yeung Lopez
(74) Attorney, Agent, or Firm — Pearne & Gordon LLP

(57) ABSTRACT

A heater or cooler chamber for a batch of more than one workpiece includes a heat storage block. In the block a multitude of pockets are provided, whereby each of the pockets may be closed or opened by a controllably operated door. A heater or cooler arrangement is applied. The pockets are tailored to surround a workpiece applied therein in a non-contact closely spaced manner.

24 Claims, 10 Drawing Sheets

A # CHAMBER FOR DEGASSING SUBSTRATES

BACKGROUND OF THE INVENTION

Figure 1:
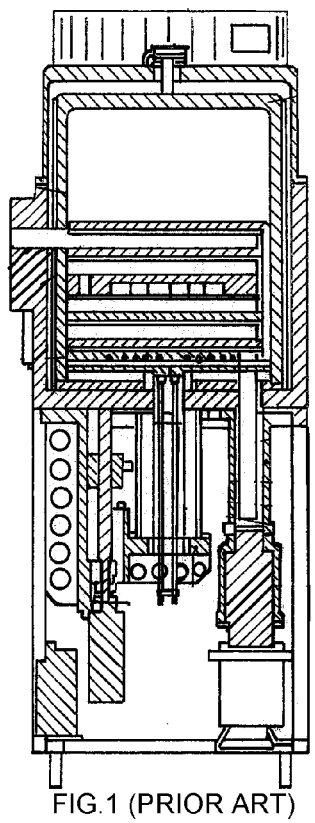

Degassing means the removal of gases, especially (i) gases from evaporated liquids like water or (ii) vapours that result from sublimating materials adhering to surfaces or (iii), in vacuum technology, substances that are outgassing from (bulk) material as soon as the surrounding pressure falls below its vapour pressure. In certain vacuum treatment processes, especially vacuum sputter coating processes degassing is an important process step, since residual gases may result in deteriorated adhesion of deposited layers or unwanted by-products in the deposits.

One differentiates between atmospheric and sub-atmospheric degassing. As the term suggests, sub atmospheric degassing takes place in an environment where the surrounding pressure can be lowered below atmospheric pressure.

It is known that degassing can be accelerated by heating the substrates thus enhancing the outgassing rate. This method may however have its limits for certain types of materials (e.g. plastics) or where the result of previous process steps could be (negatively) affected, such as melting solder bumps, warping of substrates or increased unwanted diffusion processes. Pump capacities may be improved to more quickly remove unwanted vapours and gases.

However the physics of the outgassing process itself remains the main limiting factor. In order to avoid that in an inline processing system with a sequence of defined process steps the degassing of a single substrate becomes the determining factor for the throughput, degassing is sometimes organized in batches. In other words, a plurality of substrates is being exposed jointly to an environment that assists the degassing. Such a batch degasser thus also acts as an intermediate storage for substrates Consequently, there is a need for an apparatus for degassing substrates, shortly "degasser", for (highly) outgassing substrates in a batch to enable longer outgassing times without the need to sacrifice throughput in subsequent processes.

TECHNICAL BACKGROUND

Some substrates like laminated substrates, polymer matrix substrates with embedded dies (fan-out) or substrates on tape require extended degassing time prior to subsequent vacuum processes, like PVD. A degasser for highly outgassing substrates in a batch is enabling longer outgassing times without the need to sacrifice throughput in the following process sequences, which may be single substrate processes, like in a cluster tool.

DRAWBACKS IN PRIOR ART

Batch degassers are described in U.S. Pat. Nos. 6,497,734 B1, 7,431,585 B2 and US 20110114623 A1. All these variants address a plurality of individual heater plates for each substrate; see FIG. 1 and FIG. 2. The disadvantages of stacked heater plates are the high costs and the required space.

SUMMARY OF THE INVENTION

It is thus a specific objective of the present invention to propose a batch degassing system that is efficient and inexpensive in terms of manufacturing, maintenance and operation.

To resolve the addressed objective the present invention proposes a degasser chamber for a batch of more than one substrates which comprises a heat storage block made of a single metal part or of more than one thermally narrowly coupled metal parts. The block comprises more than one pocket and in each such pocket a substrate support for a substrate. Each pocket has a substrate handling opening in a surface of the block. Each pocket is tailored to surround the respective substrate applied on its substrate support in a non-contact closely spaced manner. The substrate handling openings of the pockets are operatively connected to a respective door, which controllably frees and obstructs the respective substrate handling opening. There is further provided a heater interface to the addressed block.

Thus a solution of the addressed objective is presented which is specifically addressing degassing. As perfectly clear to the skilled artisan this solution may be exploited more generically for heating and/or cooling a batch of more than one workpieces. Further each pocket may have more than one handling opening, e.g. one for loading the pocket and one for unloading the pocket.

Thereby a more generalised objective is resolved, namely to propose a batch heat treatment system that is efficient and inexpensive in view of manufacturing maintenance and operation.

Thus, under a more generic aspect, the solution according to the invention is a heater and/or cooler chamber for a batch of more than one workpieces, especially equal workpieces, especially substrates, especially a degasser heater-chamber for such a batch, especially of substrates. Such chamber comprises a heat storage block made of a single metal part or of more than one thermally narrowly coupled metal parts. The block comprises more than one pocket and in each such pocket a workpiece support for a workpiece. Each pocket has at least one workpiece handling opening. The handling openings are located in a respective surface of the block.

Each pocket is tailored to surround a workpiece on its workpiece support in a non-contact, closely spaced manner. Thereby a good heat exchange from the block to the workpiece or from the workpiece to the block is achieved.

Each of the at least one workpiece handling openings of the pocket is operatively connected to a door which controllably frees and obstructs the respective workpiece handling opening. The term "obstructing" addresses that the respective door may close the workpiece handling opening in a gas-tight manner or may, in "obstructing" position, still establish a gas leakage between the pocket volume and the surrounding of the block.

A heater and/or cooler interface to the addressed block is provided, i.e. a thermally highly conductive surface-area whereat heater and/or cooler-means or -fluids may be brought in tight thermal contact with the block.

The pockets wherein the workpieces are heat treated are provided in the block, are e.g. machined into the block. The block is a heat storage block, i.e. acts as a heat reservoir, ensuring, once thermal equilibrium has been reached in the block, that the heating or cooling effect in the pockets is kept substantially constant. Freeing and obstructing of the workpiece handling openings has negligible effect on the thermal state of the block.

In an embodiment of the chamber according to the invention the chamber comprises a heater and/or cooler arrangement which is provided in or at a distinct outer area of the block. The thermal characteristics of the block make it possible to provide the heater and/or cooler merely at the distinct outer areas of the block. This in opposition to having e.g. a network of tubes, channels e.g. for a liquid cooling and/or heating fluid, or of wiring for electric heating worked into the block, which is by far more costly and complicated.

In an embodiment of the chamber according to the invention the chamber comprises a gas feed line arrangement which dispatches in at least some, or in each of the pockets.

Through such a gas feed line arrangement a flushing gas stream may be established through the pockets and/or the respective pocket may be pressurised to improve heat transfer from the pocket to the workpiece or vice versa. The latter is especially utilized when the heat treatment in the block is established in a surrounding vacuum atmosphere.

In an embodiment of the chamber according to the invention each of the pockets, or at least some of the pockets, are obstructed by the respective door in a gas tight manner. In one embodiment each of the pockets or at least some of the pockets are then still provided with a gas outlet.

This is e.g. realised by a desired leakage of the obstructing doors. Such a gas outlet is e.g. established whenever a gas is to be fed into the pocket as a flushing gas and is to be flown along the workpiece and out of the pocket during thermal treatment.

It is also possible to construe one and the same door to be able to provide the obstruction selectively i.e. in a gas-tight manner or leaky, e.g. by respective door-closing-control.

In one embodiment of the chamber according to the invention at least some or all the pockets are aligned in one direction along the block i.e. along one of the spacial x, y, z coordinates.

In one embodiment at least some or all the at least one openings of the pockets are aligned considered in one direction, i.e. along one of the spacial x, y, z coordinates, thereby especially in the same direction in which the respective pockets are aligned.

Thereby handling of the workpieces to and from the respective pockets by means of respective handling apparatus is significantly simplified.

Moreover, the fact that at least some or even all the at least one handling openings are aligned in one direction significantly simplifies realisation of the controllable doors.

In one embodiment of the chamber according to the invention workpieces are plate shaped, preferably substrates, and pockets are slit-shaped.

In one embodiment of the chamber according to the invention at least some of or all neighbouring pockets are thermally narrowly coupled. This means that neighbouring pockets within the metal block are located mutually close: The thermal state of a pocket is substantially uninfluenced even when a neighbouring pocket is opened, due to the thermal steady-state of the pockets in the block.

In an embodiment of the chamber according to the invention, at least some of the pockets, or all of the pockets, comprise one single workpiece handling opening.

Especially in the case where such openings are aligned along the block in one direction, workpiece handling is additionally simplified.

In one embodiment of the chamber according to the invention the doors are laid out to controllably obstruct and free at least one of the doors at the time. Even if only two pockets are provided, one or both pockets may be simultaneously opened and/or closed.

Also when more than two pockets are provided, more than one of the doors, e.g. two, are controllable for achieving an obstructing and/or freeing state simultaneously.

According to one embodiment the doors are construed to controllably have all doors obstructed together during a timespan. Thereby and irrespectively of when the doors are switched into freeing and obstructing status there exists a status of the chamber in which all the doors are in obstructing position.

In an embodiment of the chamber according to the invention at least some or all of the at least one workpiece handling openings are aligned in one direction along the block. At least some of the doors of these aligned openings are realised by a door-plate with at least one door-workpiece-handling-opening. The door-plate is controllably slideable along and relative to the block in the addressed direction. The at least one door-workpiece-handling opening is thereby brought in and out of alignment with at least one of the aligned workpiece handling openings of the pockets.

If more than one door-workpiece-handling openings are provided, more than one of the aligned workpiece-handling openings of the respective pockets may simultaneously be freed and obstructed if, considered in the addressed direction, the distance of door-workpiece-handling opening accords with the distance between workpiece-handling openings of the pockets (still in the addressed direction). Even if latter is not the case, providing more than one door-workpiece-handling openings nevertheless shortens the sliding hubs of the door plate to bring a respective door-workpiece-handling opening in alignment with a workpiece-handling opening of a pocket.

In one embodiment having a door-plate, the door-plate is operationally connected to a plate-drive. Alternatively or additionally the block is operationally connected to a block-drive.

In the embodiments discussed until now, the block may have any desired suitable shape.

Now, and in one embodiment of the chamber according to the invention, the block comprises two side faces, e.g. mutually parallel faces, as well as a front face between and linking the side faces. The heater and/or cooler arrangement is located at or in both of the addressed side faces whereas the at least one workpiece handling openings of the pockets are arranged in the front face. Thereby a separation of block areas, on one hand with the heater and/or cooler arrangement, on the other hand with handling openings, is realised. This considerably simplifies the overall construction of the chamber.

In one embodiment of the chamber according to the invention, the block is located within an isolating housing e.g. spaced from the isolating housing. The isolating housing bars heat flow between the block and the surrounding of the chamber.

One embodiment the chamber according to the invention comprises a gas feed line arrangement dispatching in each of the pockets and the pockets comprise one single workpiece handling opening.

In a further embodiment the gas feed line dispatches in at least some of the pockets opposite to the respective doors. Thus, whenever a flushing gas flow is to be established along the workpiece, the respective doors may be exploited as gas outlet by establishing a desired leakage so that the gas flows all along the workpiece.

Any number of all embodiments of the chamber according to the invention as addressed above may be combined if not mutually contradictory.

The present invention is further directed to an apparatus or system which comprises a chamber according to the present invention and possibly according to one or more than one of the embodiments described above. In such apparatus or system the chamber comprises a gas feed line arrangement dispatching in at least some or in all of the pockets. The gas feed line is operationally connected to a gas tank arrangement which contains at least one of N2, of Ar and of He.

The present invention is further directed to a method of manufacturing thermally treated workpieces, especially equal workpieces, thereby especially substrates, especially heat-degassed workpieces and makes use of a chamber or of an apparatus according to the invention, possibly of one or more than one of its embodiments.

The method comprises establishing a pre-determined temperature of the block.

A workpiece is loaded in at least one of the pockets, and on the respective workpiece support, after having freed a respective workpiece handling opening of the respective pocket by the respective door.

Then the respective workpiece handling opening of the pocket loaded with the workpiece is obstructed by the door and the workpiece is thermally treated in the pocket.

After having freed the addressed or another workpiece handling opening of the pocket by the or a respective door the thermally treated workpiece is removed through the freed workpiece handling opening from the pocket.

In one variant of the method according to the present invention loading and removing is performed through different workpiece handling openings of the pocket. Thus, loading the pocket is effected through one workpiece handling opening of the pocket and removing is performed through another workpiece handling opening of the same pocket. Alternatively loading and removing is performed through the same workpiece handling opening of the pocket.

In one variant of the method according to the present invention more than one workpiece is simultaneously loaded and/or removed to and/or from a respective number of pockets.

In one variant of the method according to the invention at least loading of workpieces in a respective number of pockets is performed in vacuum.

In one variant of the method according to the invention at least during the step of thermally treating there is established a flow of a gas along the workpiece and out of the respective pocket.

In a further variant of the method according to the invention at least loading of the workpiece is performed in vacuum at a first pressure and the respective pocket loaded with the workpiece is pressurized to a second pressure which is higher than the first pressure during treating the workpiece.

In one variant of the method according to the invention more than one pocket are loaded with a respective workpiece. This is done simultaneously or with a time lag.

The thermal treatment of these workpieces is nevertheless performed during equal time spans.

Any number of all variants of the method according to the invention as addressed above may be combined if not mutually contradictory.

The invention will now be further exemplified focused on degassing with help of figures. The figures show:

FIG. 1 a prior art degasser setup as described in the U.S. Pat. No. 7,431,585 B2.

Figure 2:
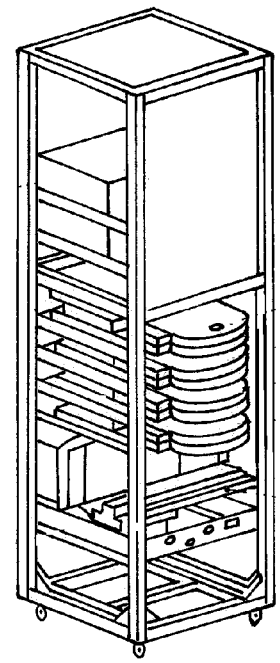

FIG. 2 a prior art batch degasser setup as described in the US 2011/0114 623 A1.

Figure 3:
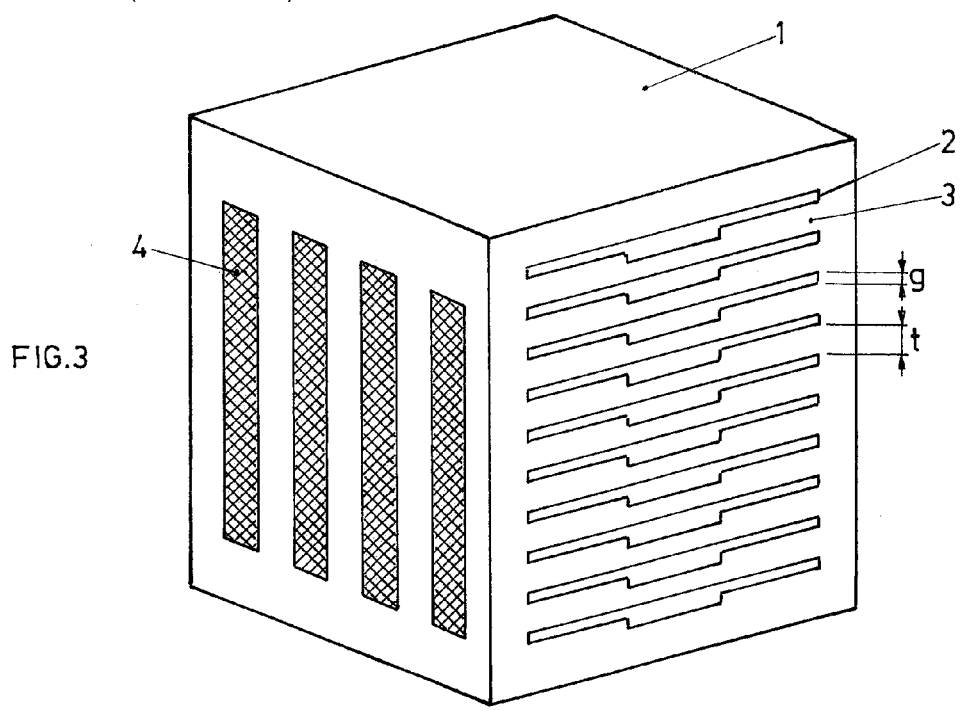

FIG. 3 in a perspective, schematic and simplified representation the basic design of the block of one embodiment of the degasser chamber according to the invention.

Figure 4:
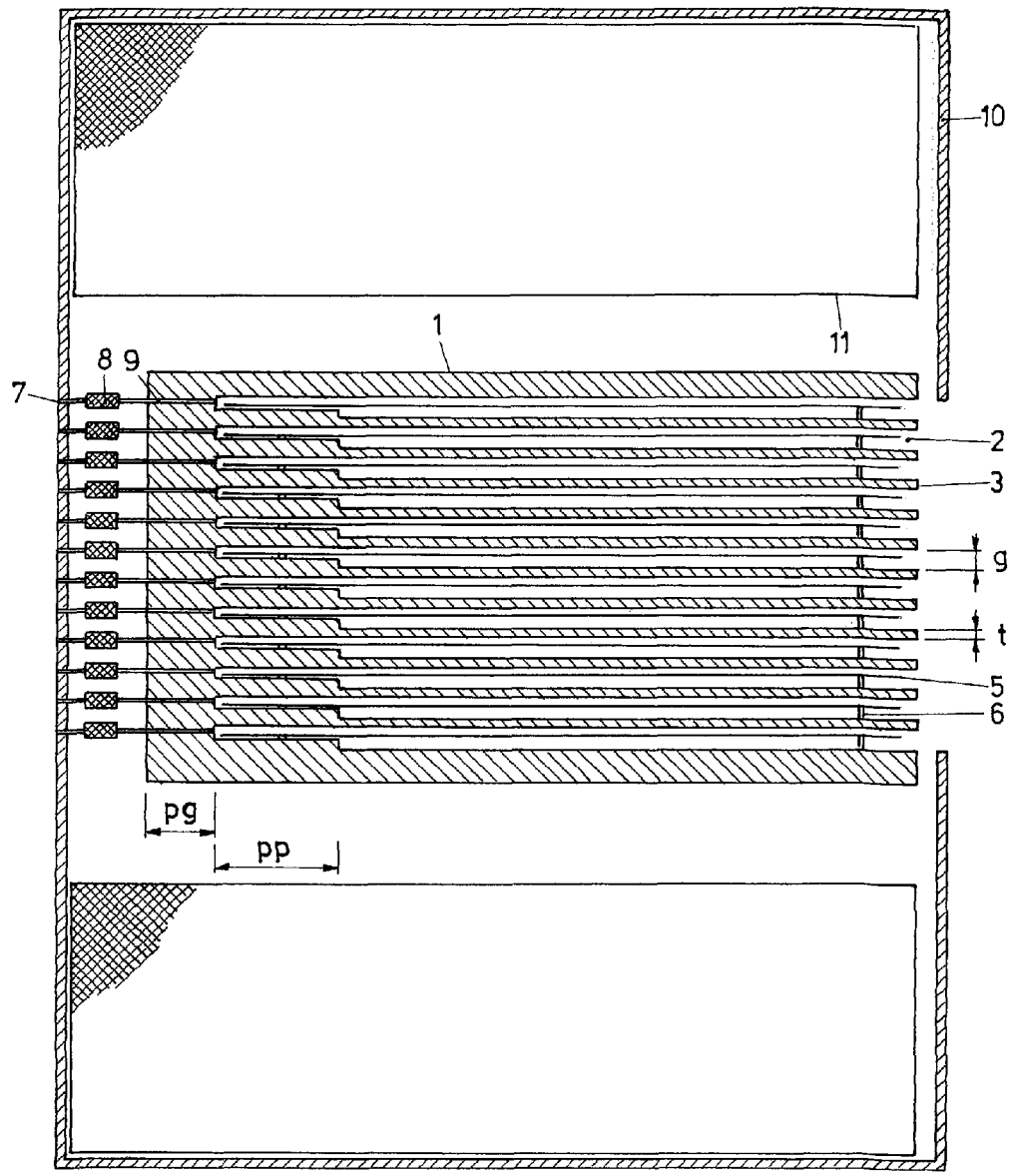

FIG. 4 schematically and simplified a cross section through an embodiment of the batch degasser chamber according to the invention with a block and a housing.

Figure 5A:
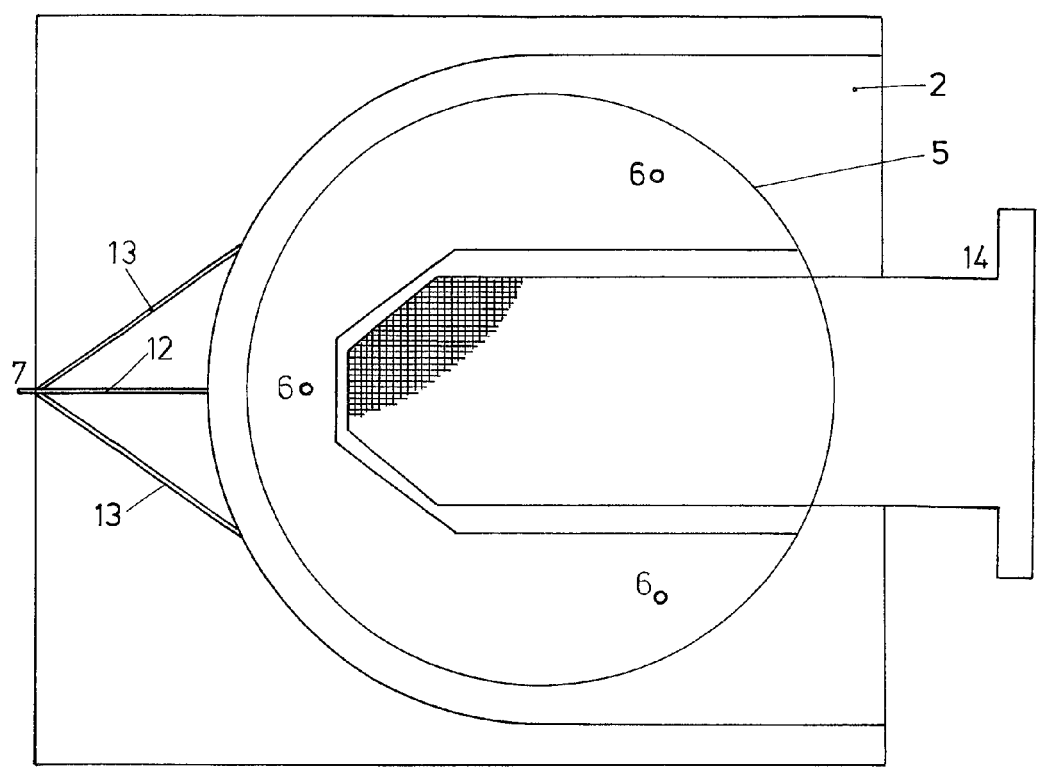

FIG. 5a front view of a section through a pocket of an embodiment of a batch degasser chamber according to the invention with a transfer arm and indicated heat flux from the block side walls.

Figure 5B:
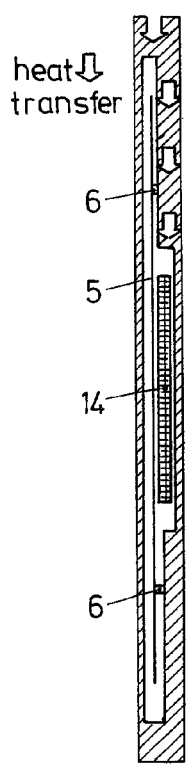

FIG. 5b a horizontal cross section through a pocket of an embodiment of a batch degasser chamber according to the invention with a transfer arm and indicated heat flux from the block side walls.

Figure 6:
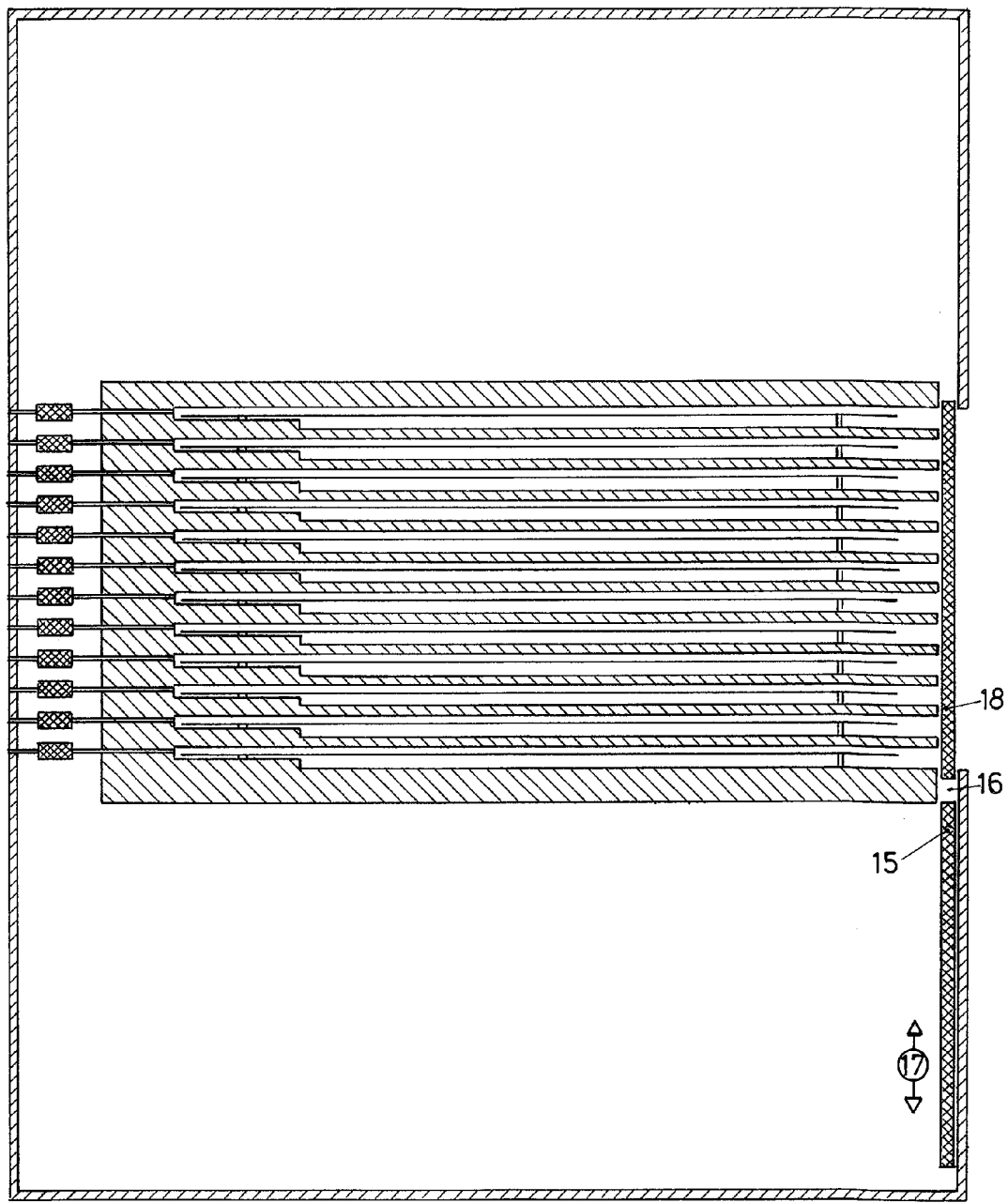

FIG. 6 schematically and simplified, a cross section through an embodiment of a batch degasser chamber according to the invention with vertical door-plate arrangement in "closed" position.

Figure 7:
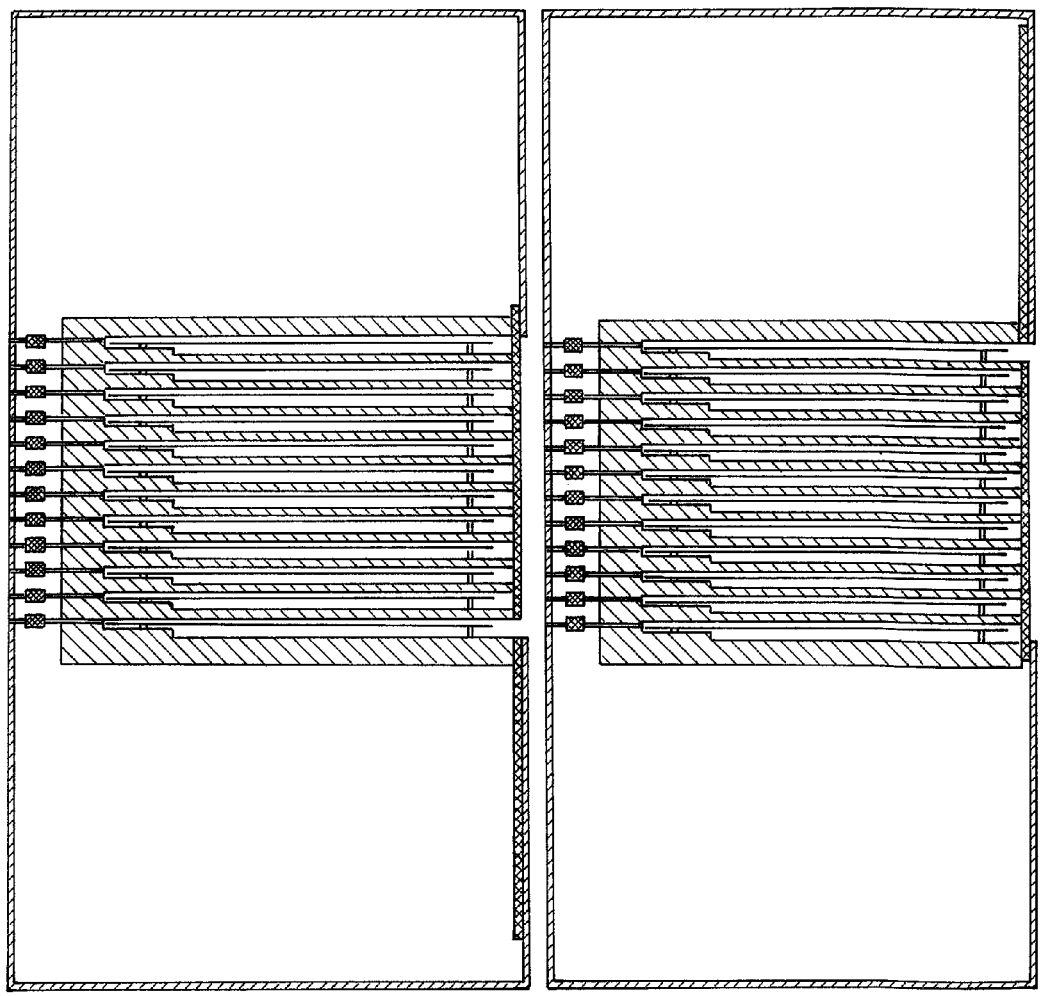

FIG. 7 in a representation in analogy to that of FIG. 6 the cross sections through an embodiment of the batch degasser chamber with a vertical door-plate in loading (freed) positon for the lowest pocket (left hand side) and for the uppermost pocket (right hand side).

Figure 8:
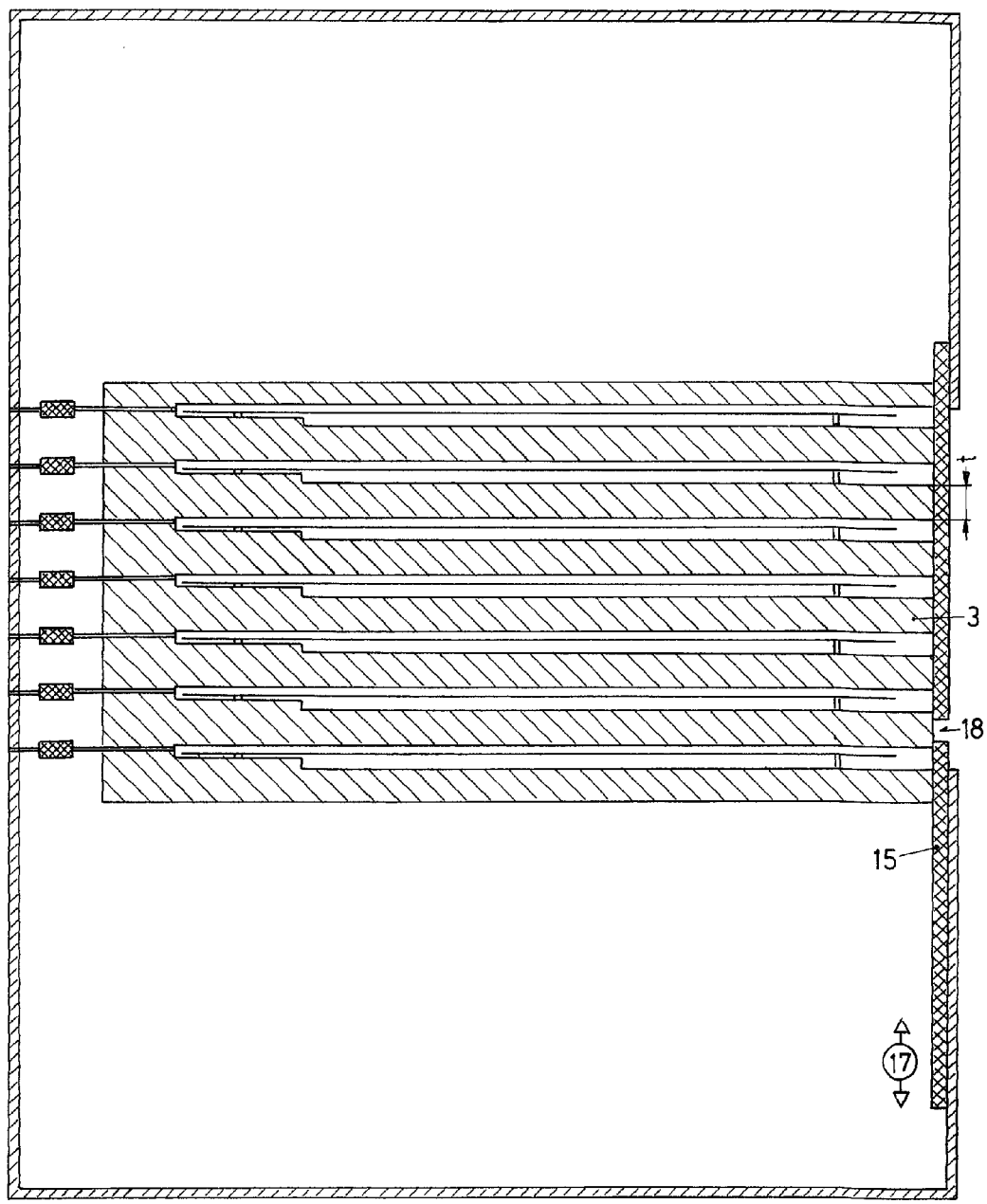

FIG. 8 in a representation in analogy to that of FIG. 6 or 7 a cross section through an embodiment of the batch degasser chamber with a vertical door arrangement having "a closed position" between neighbouring pockets.

Figure 9:
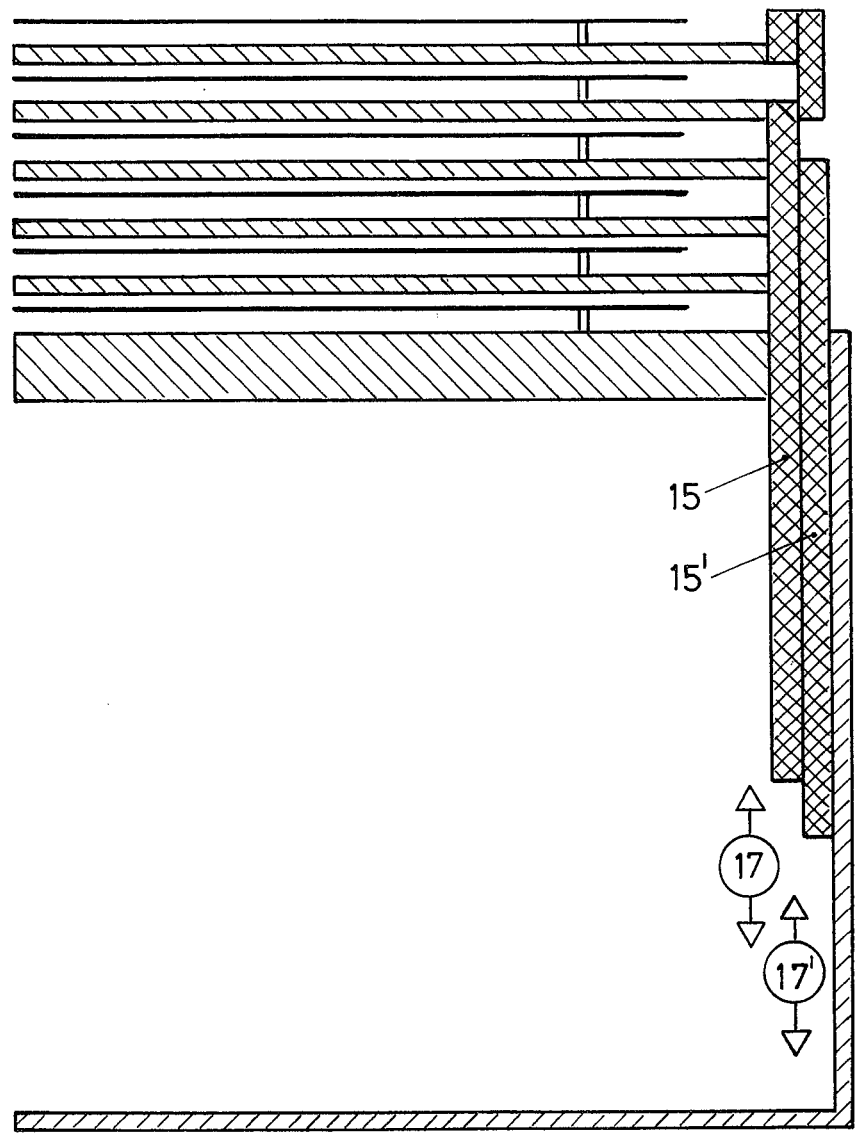

FIG. 9 in a representation in analogy to that of FIGS. 6 to 8 a part of an embodiment of a batch degasser chamber according to the invention with two door arrangements independently driven by separate drives.

Figure 10:
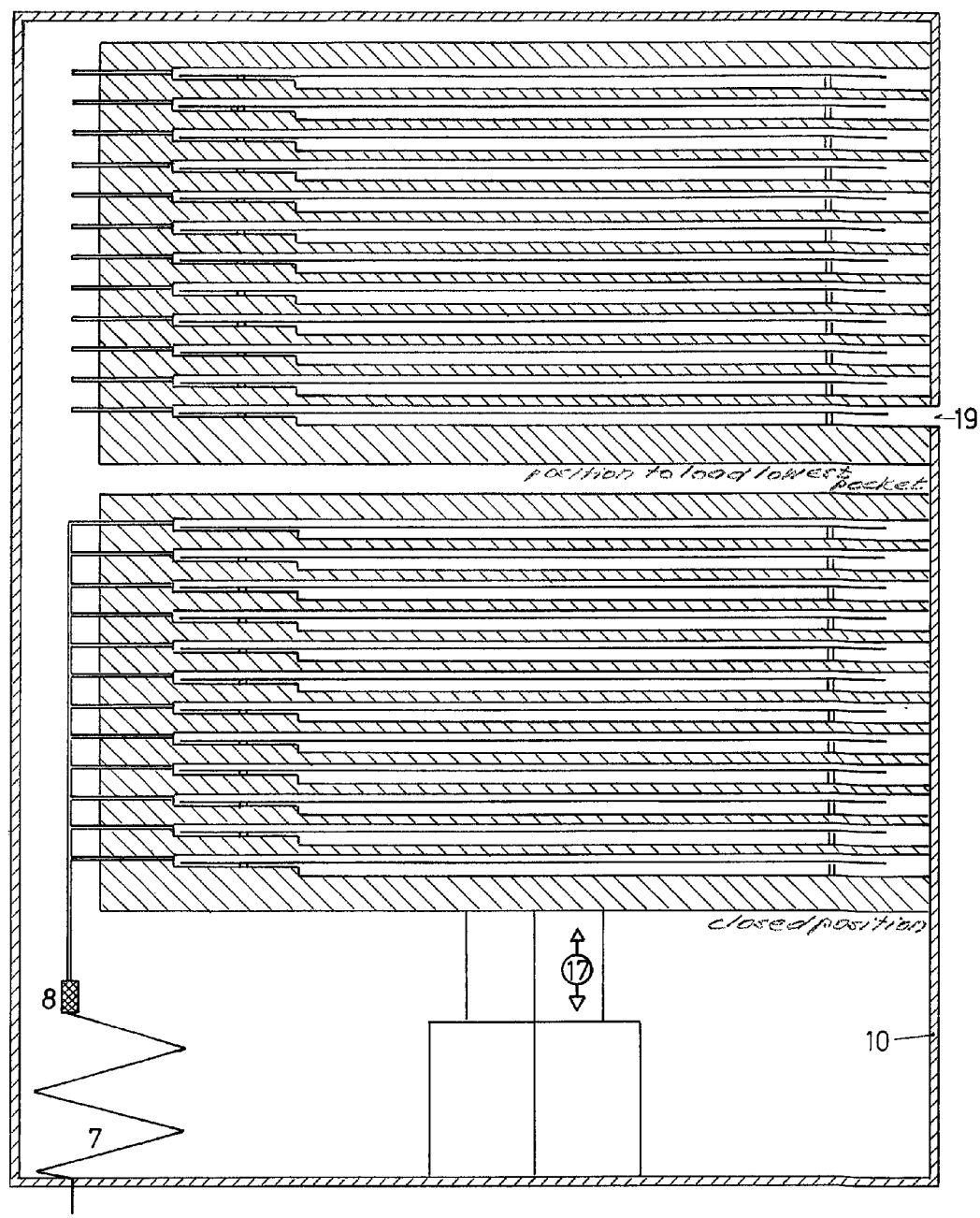

FIG. 10 in a representation in analogy to that of FIGS. 6 to 9 a cross section through an embodiment of a batch degasser chamber according to the invention with a vertical lift for the block in two positons.

Figure 11:
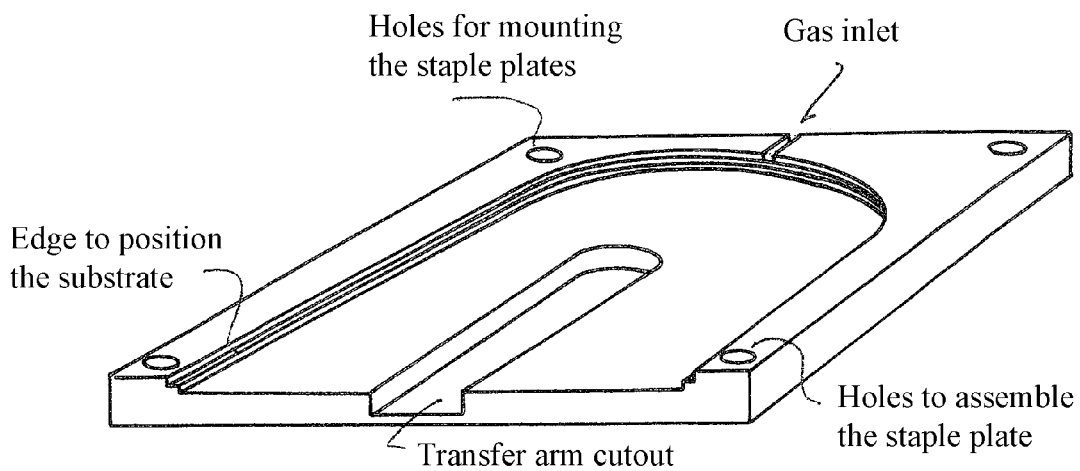

FIG. 11 a perspective view of an embodiment of a pocket design within the block of a chamber according to the invention for easy manufacturing and easy cleaning.

Figure 12:
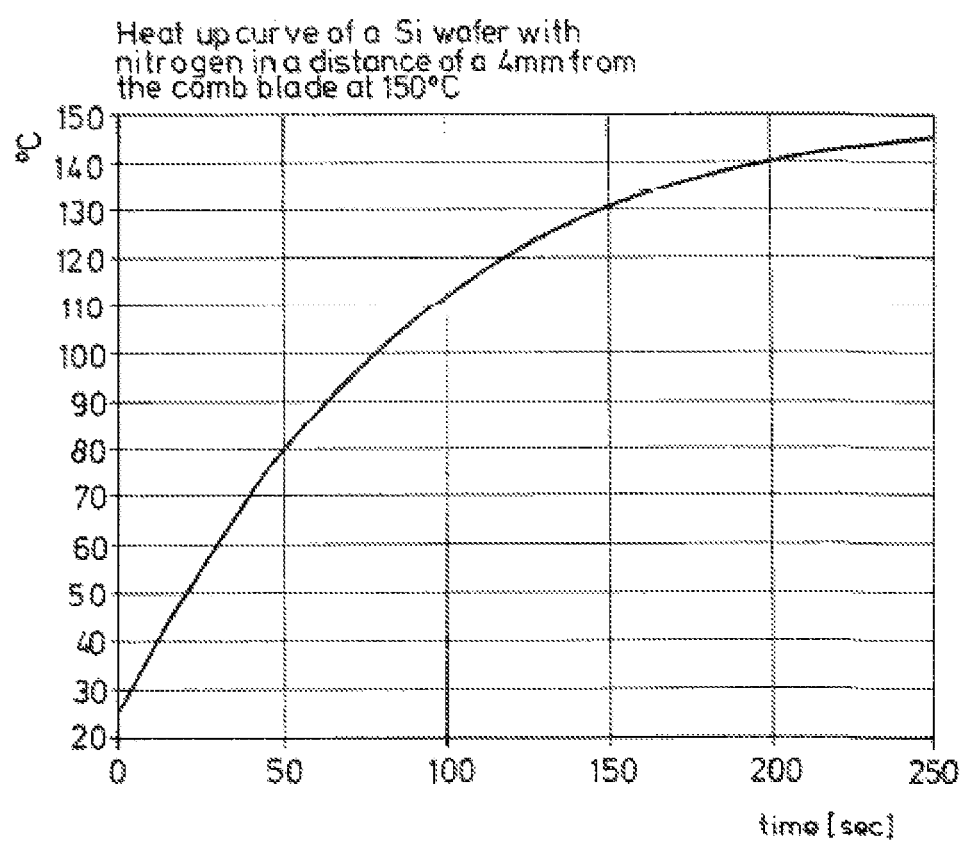

FIG. 12 the heat up curve of a Si waver with nitrogen at a distance of 4 mm from the wall of the pocket i.e. from the spacer between two neighbouring pockets (here "comb blade") calculated form conduction and radiative heat transfer.

DETAILED DESCRIPTION OF THE SOLUTION

A batch degasser according to the present invention is shown in FIG. 3. A block of thermally well conductive material 1 features a plurality of slit-like cavities or pockets 2. The front-facing portion of the block located between two adjacent pockets and labelled 3 marks a spacer between two pockets. The pockets may be machined from a single block of materials or assembled from several elements together forming said block 1. The height of each pocket is labelled g. The distance between the ceiling of one pocket 2 to the next bottom of the adjacent pocket is labelled t, so the distance between two adjacent pockets is g+t. The block is heated by heater elements arranged on the sidewalls. By using only the side-walls of block 1 and leaving empty top and bottom of it, a homogeneous temperature profile for all pockets can be achieved.

FIG. 4 shows a vertical cross section through the batch degasser according to the invention. The substrates 5 to be heated are positioned on pins 6 inside the pockets 2. Each of the pockets 2 is preferably supplied by a purge gas line 7, which may be equipped with a filter 8 to avoid particles. The purge gas inlet is preferably a shallow gas cavity 9 with a length pg intended to preheat the purge gas in the heated degasser block 1 before it enters the pocket 2 itself. The gas inlet is arranged preferably in the upper portion of the pocket since it is the goal to achieve a laminar gas flow on top of the substrate, where outgassing is especially required. The pocket has an inner profile (pp) which is minimizing its volume, such that just the space required for the transfer arm is cut out of the block.

The batch degasser block is positioned in a housing 10. This housing may include an appropriate isolation 11 to avoid heat loss of the block 1. This concept of a fixed position of the block inside the housing is proposed for a substrate loading system with a transfer arm having a vertical drive (z-drive). The maximum number of pockets of the degasser block is then limited by the range of the vertical z-drive.

FIG. 5 shows a front view (right) and a horizontal cross section (left) through the batch degasser with a substrate 5 placed on pins 6. The pocket 2 is open to one side in order to allow for loading and unloading the substrate. On the opposite side the inner contour of the pocket is rounded to match the outer shape of a circular substrate (wafer) and thus to enable a good heat transfer inside the block. The position of the pins 6 allows a safe operation of the substrate with a transfer arm 14 (shown during load/unload operation). The inner contour of the pocket is just machined wide enough to take up the transfer arm and the substrate during transfer. Consequently the pocket volume is minimized and the spacer 3 profile is maximized so that the best possible heat transfer is supported. The purge gas line 7 is arranged opposite to the opening. Its preheating gas cavity 9 can be a single straight line 12 or a network of distributed lines (12, 13).

To reduce heat losses from each of the pockets to the environment a door 15 is arranged adjacent to the heated block. This door 15 in FIG. 6 has a flat, plate shaped design of a size essentially twice the size of the front face of block 1. It exhibits one opening 16 of approximately the same shape as the pocket opening, preferably arranged in the middle of the door as shown in FIG. 6. The door is vertically movable by a drive (not shown) in a direction shown by arrow 17. Between the door and the pocket there is a slit 18 as small as possible to minimize the gas flux and avoid heat loss. In FIG. 6 the door is positioned with all pockets being closed.

FIG. 7 shows the door being positioned to load or unload substrates in the lowest pocket (left) and in the uppermost pocket (right). The plate shaped door allows to keep all pockets closed during a load/unload operation with the exception of the pocket to be accessed. The position can be determined either by means of a sensor or markings or electronically with the aid of a stepper motor.

An alternative embodiment is shown in FIG. 8 where the spacers 3 have such an increased thickness (t) that the opening in the movable door 15 is being covered by the front-facing spacer area between two pockets. This has certain advantages when operating the door because there are many "fully closed between pockets" positions (one less than the number of pockets). There is however the disadvantage that at a given maximum height of the degasser stack less substrates can be processed than in the version described above.

FIG. 9 shows another alternative solution with two doors 15, 15' independently movable in the direction 17, 17' as shown in FIG. 9. The two opening slits being offset just so much to have a "closed" configuration, a through-opening can be quickly realized by aligning both openings. This solution will allow for better thermal insulation while still allowing a compact arrangement of pockets as described for FIG. 6.

For all those embodiments the load operation will comprise:

Determining an empty pocket inside the degasser block. This can be realized either by a sensor giving a respective (occupied/free) signal or by an electronic controller supervising the status of the pockets. Such a controller could also transmit an "all pockets full" signal to the Load/Unload handling system.

Giving access to a free pocket by aligning the opening 16/18 in door 15/15' with the respective opening in block 1.

Placing a substrate on a handler capable of performing a z-motion (i.e. vertically in embodiments according to FIGS. 6-9) and aligning the handler with the door Introducing the substrate through the opening 16/18 in door 15/15' into pocket 2

Placing the substrate on pins 6

Retracting the handler from the pocket

Closing the opening to pocket 2 depending on the a.m. closing options (FIG. 6, 8, 9)

If a transfer arm with a vertical drive is not available, an alternative solution could be to vertically move whole block 1 inside the housing 10 by a drive 17 as sketched in FIG. 10. In this case there is one opening 19 located at a defined position in the housing 10 which can be also be closed or avoided by the z-movement of the block. FIG. 10 shows the "closed" position and the position to load or unload the lowest pocket of the block in the same sketch. The purge gas line 7 has to support the vertical movement by a flexible line prior to the optional gas filter 8.

All those door variants have in common that they do not need a flap or tiltable cover arrangement for the access opening and that not individual doors per pocket are required. The drive(s) for the vertical displacement of the door plate(s) 15, 15' may be arranged above or below block 1 and will thus not block any space where the loading and unloading operation takes place.

A further requirement for a batch degasser is that it needs to be cleaned efficiently from time to time. Outgassing material may condense and accumulate at certain cool spots and result in contaminated surfaces, flaking or dust. The design sketched in FIG. 11 has the advantage of a simplified manufacturing of the pockets and also their easy cleaning. In an Al block a cavity is machined from the top, including a cut-out for the transfer arm, an edge to position the substrate (instead of pins) and the gas inlet. The pocket plate has holes on all the 4 corners to stack or pile any number of degas pocket plates in an easy way. The heaters are installed on the side wall of the block as shown in FIG. 1. It has to be mentioned that for regular applications with rigid substrates the cut-out for the transfer arm can be minimized since the transfer arm in atmospheric environment can hold a substrate with a vacuum gripper. In this case, for releasing the substrate no or only a small movement away (downwards in case of FIG. 11) is necessary to allow the retraction of the handler/gripper.

An important feature of the invention is that the block 1 is made of thermally well conducting material and is embedded in a housing 10, which supports preserving a uniform temperature profile. The door 15 also contributes to this temperature uniformity. As soon as a substrate is loaded into one of the pockets 2 a temporarily heat drain will occur. Example: To heat up a silicon wafer with 300 mm diameter and 0.77 mm thickness from room temperature to 150° C. requires energy of 11 kJoule. If this energy can be received from a slab of aluminium as the suggested spacer 3 with 320 mm diameter and 5 mm thickness, the temperature of this spacer would be reduced by 17° C. However the heat exchange between the substrate and the spacer 3 is relatively slow compared to the heat conductivity within the block 1, so that with the help of the heater elements 4 the block will not experience relevant temperature non-uniformity.

The proposed batch degasser is preferably run at atmospheric pressure. However the basic ideas may be applied for low pressure degassing. An effective conductive heat transfer is possible if the gas pressure is >1 kPa.

Nitrogen is the preferred purge gas since it avoids possible oxidation of pre-processed devices on the substrate. The heat conductivity of nitrogen is fairly good (see table below) and it has a low price. Argon or Helium may also be used. Helium has superior heat conductivity, however in this case it may be necessary to keep the leak rate low for cost reasons. On the other hand nitrogen has a better momentum transfer to the molecules to be removed, like water vapor due to similar masses.

N2 0.026 W/m K
Ar 0.0167 W/m K
He 0.149 W/m K

FIG. 12 shows the heat up of a Si wafer with nitrogen measured at a distance of 4 mm from the spacer under the equipment and wafer parameters shown in the table below. The calculation includes conductive radiative heat transfer within the pocket.

| Equipment Parameter | | Wafer Parameter | |
|---|---|---|---|
| time step | 1 sec | density | 2330 kg/m3 |
| T wafer start | 24° C. | heat capacity | 703 Ws/kgK |
| T chuck | 150° C. | wafer thickness | 0.77 mm |
| eps Cavity up | 0.4 | eps backside | 0.6 |
| T Cavity | 150° C. | eps frontside | 0.6 |
| eps Cavity up | 0.4 | area ratio | 1 |
| gas conductivity | 0.026 W/mK | | |
| gap wafer to cavity | 4 mm | | |
| alpha | 6.5 W/m2K | | |

A process sequence for a batch degasser according to the invention with n pockets may look like the following:

Heat block 1 to a temperature set point, typically 150° C.
Position door 15 to the lowest pocket #1
Load a substrate into pocket #1
Position door 15 in a closed position
Adjust a flow of nitrogen to about 50 to 1000 sscm, preferably 100 sscm, in pocket #1
Repeat steps 3 to 5 for pocket #2 up to pocket #n
Unloading will happen as follows, here described for pocket #1:
Switch off the nitrogen flow in pocket #1
Position the door to pocket #1
Unload the substrate from pocket #1 to the vacuum load lock of the deposition tool. This should happen in the shortest possible time to avoid cool down of the substrate or condensation.
Load a new substrate in pocket #1

For a continuous processing of substrates the load/unload sequence is repeated accordingly. The sequence above basically describes a FIFO (first in first out) behaviour. However, this may not be necessary when sufficient substrates in block 1 have reached a thermal equilibrium, then a random access could be realized also.

SUMMARY OF FEATURES

A batch degasser setup including:
A compact block made of a material with good heat conductivity with 6 to 50 cut out pockets. The block may be made from a single piece or assembled from individual parts to form one compact block as described above.

This block being heated from the side walls and located in an insulated housing.

The pockets having a minimal volume for safe substrate handling on pins in this pocket, cut out to enable a good heat transfer from the side wall of the block to the inner surface of the pocket.

The spacers between the pockets having a minimal height and designed for providing an optimized heat transfer to the loaded substrate.

A sliding door between the block and the housing only opening the pocket where a substrate is required to be loaded or unloaded.

Providing for the sliding door at least one position where all pockets are closed.

Alternatively a design where the whole block is moving in the housing and a slot in the housing serves as shut-off for the pockets.

A method to use a batch degasser as described above:
In a continuous mode, so that each wafer stays in a pocket for the same time (FIFO).

Using nitrogen or another gas to transfer heat and flush degassing material.

Preferably, allowing a minimal time for transfer of the substrate to a vacuum load lock of the deposition tool to avoid unnecessary cool down. Consequently the substrate may stay in the pocket until an empty load lock is available.

The invention claimed is:

1. A heater and/or cooler chamber for a batch of workpieces, comprising:
   a full material heat storage block of metal made of a single metal part or of plural thermally narrowly coupled metal parts, said block contoured to define integrally formed, spaced pockets within the block,
   in each pocket, a workpiece support for at least one of the workpieces,
   each pocket having at least one workpiece handling opening in a surface of said block,
   each pocket surrounding the respective at least one of the workpieces applied on the workpiece support with the material of the block in a noncontact, closely spaced manner,
   each of the at least one workpiece handling openings of said pockets being operatively connected to a door controllably freeing and obstructing the respective workpiece handling opening, and
   a heater and/or cooler interface along an outer surface of said block.

2. The chamber of claim 1 comprising a heater and/or cooler arrangement provided in or at a distinct outer area of said block.

3. The chamber of claim 1 comprising a gas feed line arrangement dispatching in at least some of said pockets or in all of said pockets.

4. The chamber of claim 1 at least some or all of said pockets being substantially gas-tight when the workpiece handling opening is obstructed by said door or at least some or all of said pockets comprising a gas outlet.

5. The chamber of claim 1 at least some or all of said pockets being aligned in said block in one direction.

6. The chamber of claim 1 at least some or all of said at least one openings of said pockets being aligned in one direction along said block.

7. The chamber of claim 1 wherein workpieces are plate shaped, preferably substrates, and pockets are slit-shaped.

8. The chamber according to claim 1 wherein at least some or all of neighbouring pockets are thermally narrowly coupled.

9. The chamber according to claim 1 at least some or all of said pockets comprising one single workpiece-handling opening.

10. The chamber according to claim 1 said door being controllable to obstruct and free at least one of said workpiece handling openings at a time, or more than one of said workpiece handling openings simultaneously, and/or said door being further controllable to have all workpiece handling openings obstructed together during a time span.

11. The chamber according to claim 1 wherein at least some or all of the at least one workpiece handling openings are aligned in one direction and at least some or all of the door is realized by a door-plate with at least one door-workpiece-handling opening, said door-plate being controllably slideable along and relative to said block in said direction so as to selectively bring said at least one door-workpiece-handling opening in and out of alignment with at least one of said aligned workpiece-handling openings of said pockets.

12. The chamber of claim 11 wherein said door-plate is operationally connected to a plate-drive for said relative sliding.

13. The chamber of claim 11 wherein said block is operationally connected to a block-drive for said relative sliding.

14. The chamber of claim 2 wherein said block comprises two side faces and a front face and said heater and/or cooler arrangement is located at or in both side faces, said at least one workpiece handling opening is arranged in said front face.

15. The chamber of claim 1 wherein said block is mounted within an isolating housing, which is preferably spaced from the block.

16. The chamber of claim 1 comprising a gas feed line arrangement dispatching in at least some or in all of said pockets, said gas feed line dispatching in said pockets opposite to said door.

17. An apparatus comprising a chamber according to claim 1, and comprising a gas feed line arrangement dispatching in at least some or in all of said pockets, said gas feed line being operationally connected to a gas tank arrangement containing at least one of N2, Ar, He.

18. A method of manufacturing thermally treated workpieces using a chamber according to claim 1 and comprising the steps of:
   Establishing a predetermined temperature of said block
   Loading a workpiece in at least one of said pockets, and on the respective workpiece support, after having freed a respective workpiece handling opening of the respective pocket by the respective door
   Obstructing the respective workpiece handling opening of the pocket, loaded with said workpiece
   Thermally treating said workpiece in said pocket
   Freeing said or another workpiece handling opening of the pocket by a respective door and
   Removing said thermally treated workpiece through said freed workpiece handling opening or said other freed workpiece handling opening from said pocket.

19. The method of claim 18 comprising performing said loading and said removing through different workpiece handling openings of said pocket.

20. The method of claim 18 comprising loading and/or removing more than one workpiece simultaneously to and/or from a respective number of said pockets.

21. The method of claim 18, wherein at least said loading is performed in vacuum.

22. The method of claim 18 comprising establishing, at least during said thermally treating, a flow of a gas along said workpiece and out of the pocket.

23. The method of claim 18 thereby performing at least said loading in vacuum at a first pressure and comprising pressurizing the respective pocket, loaded with a workpiece, to a second pressure, higher than said first pressure.

24. The method of claim 18 comprising loading more than one pocket with a respective workpiece simultaneously or with a time lag and performing said thermal treating of said more than one workpieces during equal time spans.

* * * * *